United States Patent
Kwong

[19]

[11] Patent Number: 6,052,019
[45] Date of Patent: Apr. 18, 2000

[54] UNDERSHOOT-ISOLATING MOS BUS SWITCH

[75] Inventor: David Kwong, Fremont, Calif.

[73] Assignee: Pericom Semiconductor Corp., San Jose, Calif.

[21] Appl. No.: 09/182,347

[22] Filed: Oct. 29, 1998

[51] Int. Cl.[7] .................................................. H03K 3/01
[52] U.S. Cl. ...................... 327/437; 327/427; 327/387; 327/391; 327/534
[58] Field of Search ................................... 327/427, 437, 327/379, 534, 535, 387, 389, 391, 309

[56] References Cited

U.S. PATENT DOCUMENTS

| | | | |
|---|---|---|---|
| 4,945,267 | 7/1990 | Galbraith | 327/434 |
| 5,060,037 | 10/1991 | Rountree | 357/23.13 |
| 5,289,062 | 2/1994 | Wyland | 327/389 |
| 5,546,017 | 8/1996 | Vitunic | 326/30 |
| 5,608,275 | 3/1997 | Khosrowpour | 307/130 |
| 5,673,277 | 9/1997 | Amitai et al. | 371/22.3 |
| 5,751,168 | 5/1998 | Speed, III et al. | 326/83 |
| 5,808,502 | 10/1999 | Hui et al. | 327/382 |
| 5,825,227 | 10/1998 | Kohama et al. | 327/427 |
| 5,929,690 | 7/1999 | Williams | 327/427 |
| 5,963,080 | 10/1999 | Miske et al. | 327/437 |

*Primary Examiner*—Dinh T. Le
*Attorney, Agent, or Firm*—Stuart T. Auvinen

[57] ABSTRACT

A bus switch has an n-channel bus-switch transistor that connects an input-bus signal to an output bus. A gate protection circuit prevents undershoots on the inputs from coupling to the output when the bus switch isolates the buses. The gate of the bus-switch transistor is driven to ground during isolation mode. When a high-to-low transition of the input-bus signal is detected, a pulse generator generates a pulse. The pulse disconnects the gate from ground. A connecting n-channel transistor with its gate connected to ground connects the gate to the input-bus signal when the undershoot pulls the input-bus signal below ground. Internal circuitry is isolated from the below-ground gate by an isolating n-channel transistor that has its gate driven by the input-bus signal during the pulse. A substrate bias generator is used for N-well processes, but P-well processes use a well protection circuit. The P-well under the bus-switch transistor is disconnected from ground during the generated pulse. Another n-channel connecting transistor with its gate grounded connects the P-well to the input-bus signal when the undershoot occurs. The protection circuits are only enabled when the bus switch transistor is in the isolation mode and a low-going transition of the input-bus signal is detected.

20 Claims, 6 Drawing Sheets

UNDERSHOOT-ISOLATING MOS BUS SWITCH

FIELD OF THE INVENTION

This invention relates to semiconductor bus switches, and more particularly to undershoot protection for a MOS bus switch.

BACKGROUND OF THE INVENTION

Bus switches are widely used for networking applications. Metal-oxide-semiconductor (MOS) bus switches feature low on resistance, reducing delay through the switch. See for example "Parallel Micro-Relay Bus Switch for Computer Network Communication with Reduced Crosstalk and Low On-Resistance using Charge Pumps", U.S. Pat. No. 5,808,502, and "Bus Switch Having Both P- and N-Channel Transistors for Constant Impedance Using Isolation Circuit for Live-Insertion when Powered Down" U.S. Ser. No. 09/004,929. The source and drain nodes of the transistor connect to the busses while the gate is controlled by a bus-connecting enable signal.

FIG. 1 shows a typical application of a bus switch. Local bus signals 18 (bus A) is connected to CPU 12, memory 14, and Application-Specific Integrated Circuit (ASIC) 10. Hot-plug bus signals 19 (bus B) is a hot-plugable expansion bus such as for PC or PCI cards. Switch network 16 connects address, data, and control lines from bus signals 18 to bus signals 19 using MOS transistors. Once transistor is used for each bus signal.

When a device is plugged into bus signals 19, it may be desired to isolate bus signals 19 from local bus signals 18. Noise caused by the plugging operation can then be isolated to bus signals 19, allowing local bus signals 18 to operate unhindered. Switch network 16 can isolate bus signals 19 from local bus signals 18 by applying a low voltage to n-channel transistors in switch network 16.

FIG. 2 illustrates a single bit of a bus switch. A signal from local bus 18 is connected to a corresponding signal on bus 19 by n-channel bus switch transistor 22. When a high voltage is applied to the gate of bus switch transistor 22, it allows current to flow from drain to source, connecting a signal in bus 18 to bus 19.

P-channel pullup transistor 24 connects the output on bus 19 to the power supply when bus switch transistor 22 is non-conducting. Pullup transistor 24 prevents output bus 19 from floating when bus switch transistor 22 isolates bus signals 18, 19. When the gates of bus switch transistor 22 and pullup transistor 24 are driven with full-rail voltages, only one of transistors 22, 24 is on at any time. The bus switch acts as an open circuit when isolating bus signals 18, 19.

Undershoot Problem—FIG. 3

FIG. 3 illustrates an undershoot problem with the bus switch of FIG. 2. When the bus switch is disabled by driving a ground voltage to the gate of the n-channel bus-switch transistor and the p-channel pullup transistor, the output to bus signal 19 should be isolated from voltage changes at the input, bus signal 18. The quality of the signal waveforms on local bus signal 18 is not always well controlled. Sometime large voltage spikes below ground (undershoots) occur, especially on the high-to-low transitions from high-current drivers on local bus signal 18.

When the bus-switch input from bus signal 18 goes below ground, a positive gate-to-source voltage develops on bus-switch transistor since its gate is at ground. A conducting channel forms below the gate. When the undershoot is greater than a volt, this gate-to-source voltage exceeds the n-channel threshold voltage, turning on the n-channel bus switch transistor. Some current is conducted through the channel of the bus-switch transistor even though its gate may be kept at ground. The result is that the voltage is disturbed on the drain of the bus-switch transistor, and the output to bus 19.

When the source of the n-channel bus-switch transistor goes negative during the undershoot, the base-emitter junction of the parasitic lateral NPN transistor is forward biased, coupling more current to the output through the p-type substrate.

The result of the undershoot is that the output connects to the input for a short period of time, the duration of the undershoot. The voltage on the drain of the bus-switch transistor can quickly fall from the power supply (Vcc) to ground and even below ground should the undershoot last for more than a few nanoseconds. Thus FIG. 3 shows the undershoots on the input bus coupled to the output, producing severe voltage disturbances on the isolated bus.

One solution is to use a diode to clamp the input to ground. FIG. 4 shows a bus-switch protected from undershoots by a Schottky diode. Input bus signal 18 is coupled to Schottky diode 28, which turns on and conducts current to ground when the input on bus signal 18 falls below ground.

While Schottky diodes were common for bipolar processes, most standard CMOS processes do not include Schottky diodes. Extra expense and process complexity is required to include Schottky diode 28. Thus Schottky diode 28 is undesirable for integrated circuits (ICs). Adding an external Schottky diode 28 also adds expense and consumes board space.

Another solution is to add a series resistor to dampen the ringing that causes undershoot. FIG. 5 highlights using a series resistor to reduce undershoot. Series resistor 29 dampens signals from bus signal 18, preventing or reducing undershoot seen at the source of bus-switch transistor 22. Unfortunately, series resistor 29 also distorts and slows signals being passed from bus 18 to bus 19 during normal operations when bus switch transistor 22 is not isolating the busses. One of the benefits of MOS bus switches is the very low on resistance. Thus adding series resistor 29 defeats one of the primary benefits of MOS bus switches.

What is desired is a bus switch using CMOS technology. Protection from undershoot on the input is desired when the bus switch is isolating its output from its input. An active undershoot-protection circuit using CMOS transistors is desired. It is desired to maintain the low on-resistance and low capacitance of the bus switch. A more fully-isolating bus switch is desirable.

SUMMARY OF THE INVENTION

An undershoot-protected bus switch has an input and an output. An enable signal indicates when the bus switch is in an isolation mode when the input is isolated from the output and indicates a connection mode when the bus switch conducts current between the input and the output.

A bus-switch transistor is coupled to connect the input to the output during connection mode, but it isolates the input from the output during isolation mode. The bus-switch transistor is controlled by a gate connected to a gate node. A connecting transistor is coupled to conduct from the input to the gate node during an undershoot below ground on the input.

A pulse generator is coupled to the input. It generates a pulse in response to a transition of the input during the isolation mode. An enabling transistor is controlled by the enable signal. It drives an enabling voltage onto the gate node during the connection mode. A disabling transistor is controlled by the enable signal. It drives a disabling voltage onto the gate node during the isolation mode.

An isolating transistor is coupled between the disabling transistor and the gate node. The isolating transistor isolates the disabling transistor from the gate node in response to the pulse from the pulse generator. Thus the disabling transistor is isolated by the pulse while the gate node is driven by the undershoot through the connecting transistor.

In further aspects the connecting transistor has a gate connected to ground. The connecting transistor conducts current when the undershoot on the input falls more than a transistor threshold below ground.

In still further aspects a connecting-pulse transistor is coupled to conduct current between the input and a gate of the isolating transistor when the pulse is generated by the pulse generator. Thus the gate of the isolating transistor is driven by the undershoot on the input. The gate of the isolating transistor is pulled below ground when an undershoot occurs on the input when the pulse is generated during the isolation mode.

In further aspects of the invention a second pulse transistor is responsive to a lack of the pulse from the pulse generator. It drives the gate of the isolating transistor with a voltage sufficient to turn on the isolating transistor so that the isolating transistor connects the disabling transistor to the gate node. Thus the isolating transistor connects the disabling transistor to the gate node of the bus-switch transistor when no pulse is generated.

In further aspects, the bus-switch transistor, the connecting transistor, the disabling transistor, the connecting-pulse transistor, and the isolating transistor are each n-channel transistors formed in an electrically common p-type substrate. Thus the bus switch is fabricated with an N-well process. A substrate-bias generator is coupled to the electrically common p-type substrate. It drives the electrically common p-type substrate to a bias voltage below ground. Thus a substrate under the bus-switch transistor is protected from undershoots by being biased below ground.

In other aspects a well-protection circuit is coupled to protected substrate nodes of the bus-switch transistor, the connecting transistor, the connecting-pulse transistor, and the isolating transistor. It drives the protected substrate nodes to ground during the connection mode, but connects the undershoot on the input to the protected substrate nodes when a pulse is generated during the isolation mode. Thus the undershoot on the input is coupled to drive the protected substrate nodes to prevent the bus-switch transistor from turning on during the isolation mode.

In further aspects the disabling transistor is not connected to the protected substrate nodes of the bus-switch transistor and the isolating transistor. The disabling transistor has a separate substrate node connected to ground. Thus a P-well process is used to fabricate the bus switch, wherein separate P-wells are isolated by an n-type substrate.

DETAILED DESCRIPTION

The present invention relates to an improvement in MOS bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that active protection circuits can be added to a MOS bus switch to protect against undershoots when the bus switch is isolating. These active protection circuits connect the gate of the n-channel bus switch transistor to the input when the input goes below ground. Likewise, the substrate can be connected to the input when the input falls below ground.

The inventor has also realized that a pulse circuit can be employed to enable the protection circuit only during high-to-low transitions of the input. Thus noise on the input at other times does not accidentally trigger the protection circuit.

Figure 6:
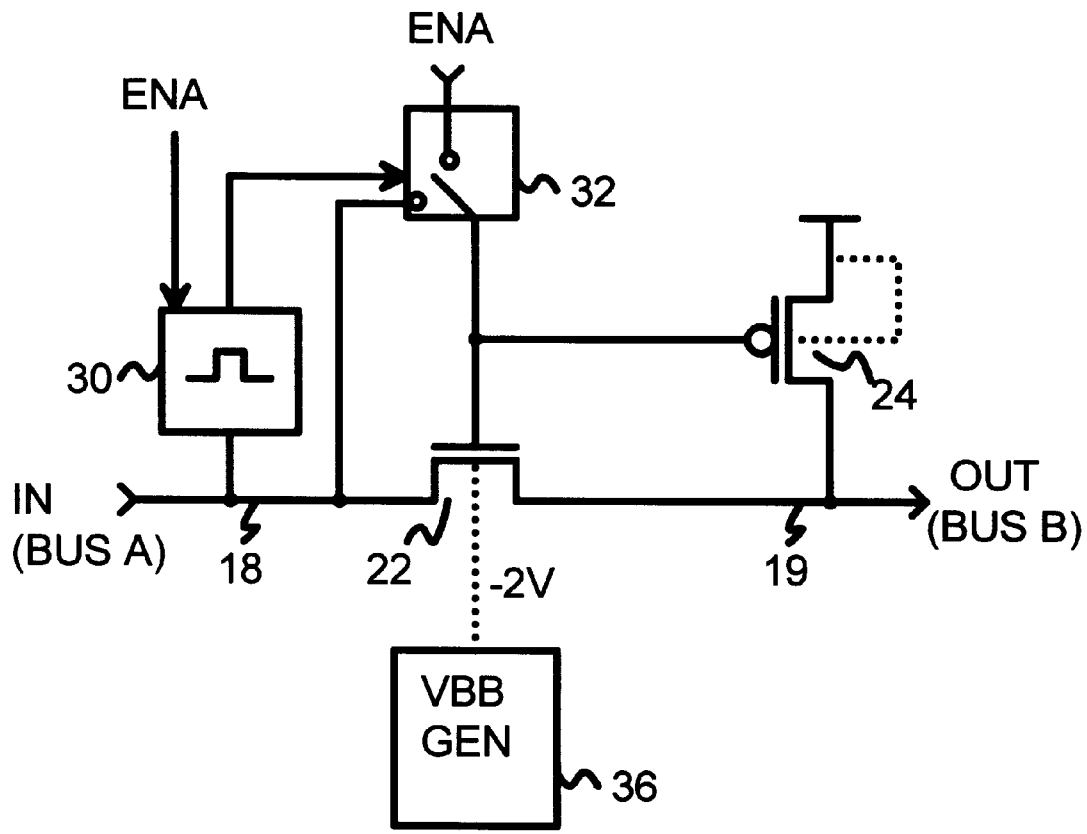
FIG. 6 highlights an undershoot-protection circuit for a gate of a bus switch.
Figure 7:
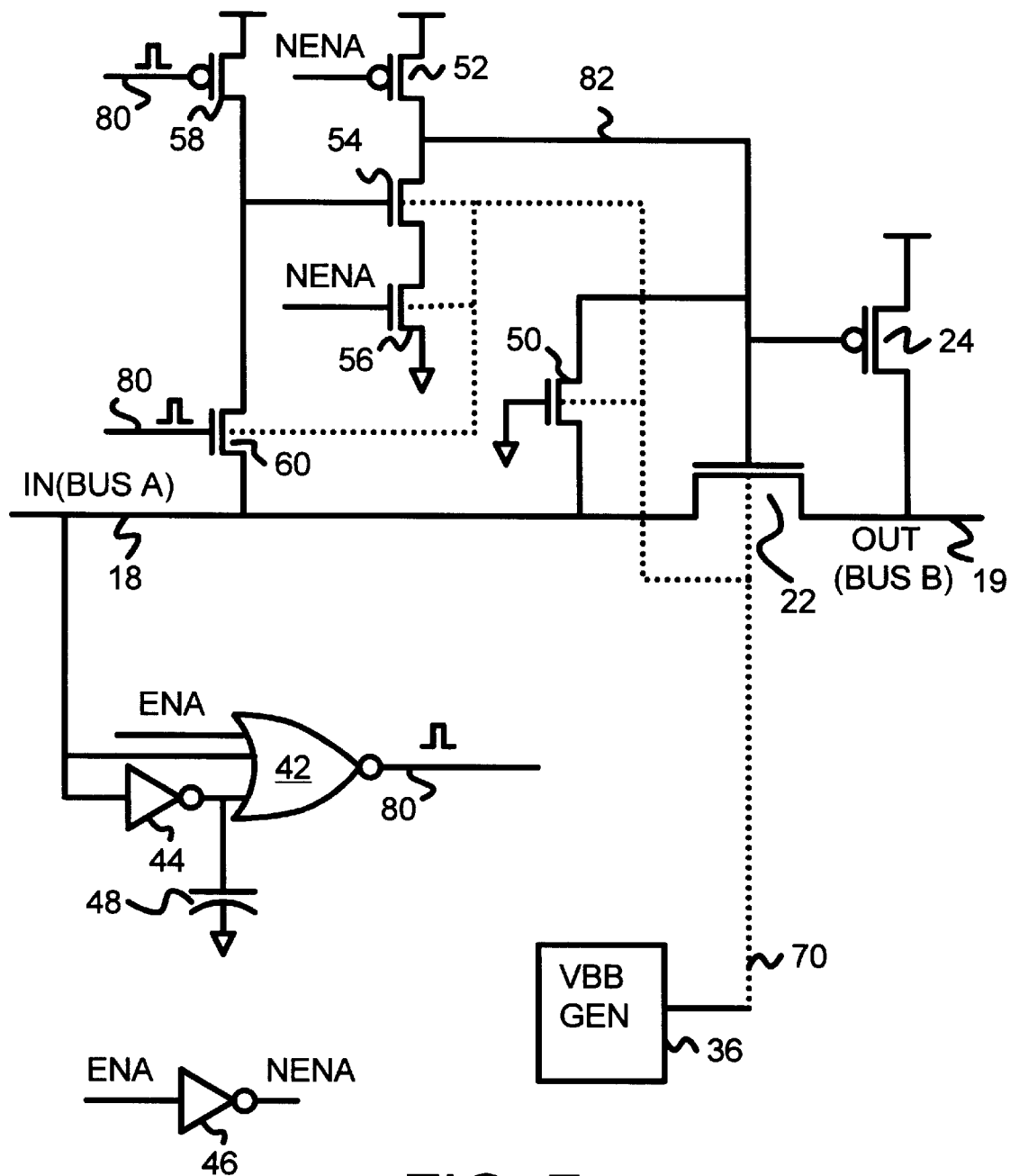
FIG. 7 is a schematic of a gate-protection circuit for a bus switch using an N-well process.

Undershoot Protection for N-Well—FIGS. 6, 7

FIG. 6 highlights an undershoot-protection circuit for a gate of a bus switch. Input bus signal 18 is connected to output bus 19 when n-channel bus switch transistor 22 is conductive. A high voltage is applied to the gate of bus switch transistor 22 by an enable signal ENA from internal circuitry. When the bus switch is enabled to connect busses 18, 19, a high voltage from the internal circuitry enable ENA is connected to the gate of bus switch transistor 22 through gate-protection switch 32.

The gate of p-channel pullup transistor 24 is also driven by gate-protection switch 32, since it shares the node with the gate of bus switch transistor 22. When a low voltage is driven to the gates of transistors 22, 24, pullup transistor 24 pulls the output bus 19 high.

When the bus switch is instructed to isolate buses 18, 19, enable signal ENA is de-activated, causing gate-protection switch 32 to drive a low voltage to the gates of transistors 22, 24. Gate-protection switch 32 is then ready to protect against input undershoots. Pulse generator 30 is also armed. When a high-to-low transition of the input bus signal 18 is detected, pulse generator 30 generates a high-going pulse that is applied to gate-protection switch 32. When both the enable ENA is low and the pulse is received by gate-protection switch 32, the internal circuitry is disconnected from bus switch transistor 22. If the input voltage on bus signal 18 falls below ground, the lower input voltage is then connected to the gate of bus switch transistor 22. Thus the lower input voltage is directed to the gate of bus switch transistor 22, preventing bus switch transistor 22 from turning on. Undershoot protection is thus provided.

Substrate bias generator 36 generates a negative bias to the p-type substrate or well under the n-channel transistors. A −2 volt bias is applied, providing undershoot protection when the voltage drops as much as 2 volts below ground. Substrate bias generator 36 also has the benefit of reducing parasitic capacitances for the n-channel transistors due to the negative back bias. All the n-channel transistors can be formed in the same p-type well or substrate. Thus this embodiment is ideally suited for N-well (p-type substrate) process technology.

FIG. 7 is a schematic of a gate-protection circuit for a bus switch using an N-well process. Substrate bias generator 36 is a charge pump that generates a −2 volt bias that is applied to substrate node 70. Substrate node 70 is the substrate node under all of the n-channel transistors. In N-well technology, all of the n-channel transistors are formed in the same substrate, so all of their substrate nodes are connected together. Even for dual-well N-well processes, it is not possible to separate some of the n-channel transistors in separate P-wells, since the P-wells would be shorted together by the underlying p-type substrate.

N-channel bus switch transistor 22 connects bus signals 18, 19 together when the enable ENA is high. Inverter 46 generates the inverse of enable ENA as NENA, which is low when the bus switch is enabled. A high voltage is driven to gate node 82 by p-channel enable transistor 52 when NENA is low.

When enable ENA goes low, NENA goes high, turning off p-channel enable transistor 52 but turning on n-channel disable transistor 56. In the absence of a low-going input transition, pulse signal 80 is low, driving a high through p-channel transistor 58 to the gate of n-channel isolating transistor 54. Gate node 82 is then driven low by disable transistor 56 through isolating transistor 54. The low voltage on gate node 82 turns off bus switch transistor 22, isolating bus signals 18, 19. P-channel pullup transistor 24 turns on, pulling the output bus signal 19 high.

When the bus switch has been disabled by enable signal ENA being low, the pulse generator is armed and waits for a low-going pulse on input bus signal 18. A high-to-low transition of input bus signal 18 can produce an undershoot at the end of the transition, and the gate-protection circuit is only enabled immediately after such a low-going transition, when the possibility of an undershoot is the greatest.

The pulse generator is a one-shot generator that includes NOR gate 42, inverter 44, and capacitor 48. When enable ENA is low, NOR gate 42 is armed and can generate a high-going pulse when input bus signal 18 goes low. Initially, when input bus signal 18 is high, the output of inverter 44 is low, so 2 of the 3 inputs to NOR gate 42 are low. The middle input also becomes low as soon as input bus signal 18 transitions from high to low. Then all 3 inputs to NOR gate 42 are low, and its output, pulse signal 80, goes high. The low on input bus signal 18 eventually drives the output of inverter 44 high, but capacitor 48 must be charged up by inverter 44 before a high voltage is input to NOR gate 42 by inverter 44 to end the pulse. The length of the high-going pulse on pulse signal 80 depends on the value of capacitor 48, and the current drive and delay of inverter 44, as well as logic thresholds of NOR gate 42 and inverter 44, and the waveform of input bus signal 18.

The pulse on pulse signal 80 generated by NOR gate 42 is applied to n-channel connecting transistor 60, which turns on, connecting input bus signal 18 to the gate of isolating transistor 54. P-channel transistor 58 is turned off by the high pulse on pulse signal 80.

Connecting n-channel transistor 50 has its gate connected to ground and is normally off. But when input bus signal 18 falls below ground during an undershoot, a positive gate-to-source voltage develops on connecting transistor 50. When the undershoot is more than the n-channel threshold voltage, connecting transistor 50 turns on. Gate node 82 is then connected to input bus signal 18 and is pulled below ground through connecting transistor 50. Thus the below-ground voltage is coupled to the gate of bus switch transistor 22. Since both the gate and the source of bus switch transistor 22 are at the same voltage, even though the voltage is below ground, bus switch transistor 22 has a zero gate-to-source voltage and does not turn on. Output bus 19 continues to be isolated from input bus 18.

The below-ground voltage on gate node 82 could cause problems such as latch-up in other internal circuitry if connected to drains of n-channel transistors. The only n-channel drain that gate node 82 connects to is the drain of n-channel isolating transistor 54. However, the gate of isolating transistor 54 is also coupled to input bus signal 18 through connecting transistor 60, which is activated by the pulse on pulse signal 80. Thus the gate of isolating transistor 54 is also driven below ground, keeping the gate and drain (now acting as the source) of isolating transistor 54 at the same low voltage. Thus a zero gate-to-source (drain) voltage occurs, preventing isolating transistor 54 from turning on. Isolating transistor 54 thus isolates the below-ground voltage from disable transistor 56.

Once the pulse ends and NOR gate 42 drives pulse signal 80 high, the protection circuit disconnects input bus signal 18 from isolating transistor 54. However, undershoots rarely last for more than a few nanoseconds, so the undershoot should be Finished by the time the pulse ends.

Figure 8:
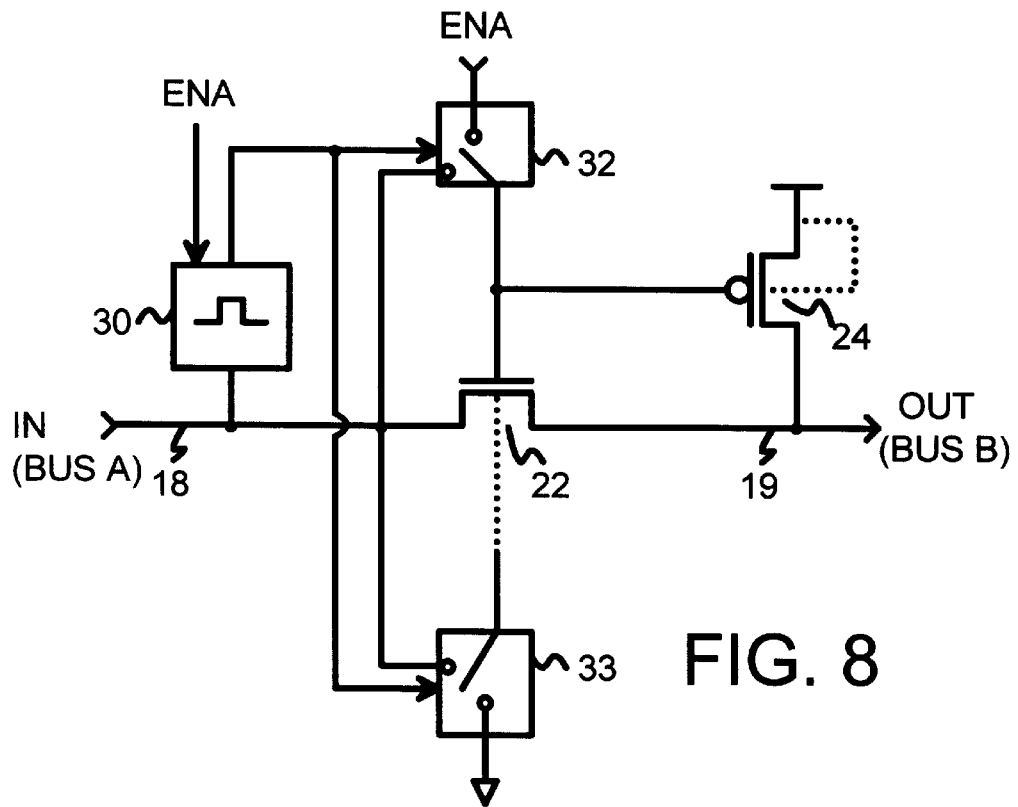
FIG. 8 shows a block diagram of an undershoot protection circuit for both the gate and the well under a bus switch when P-well technology is used.
Figure 9:
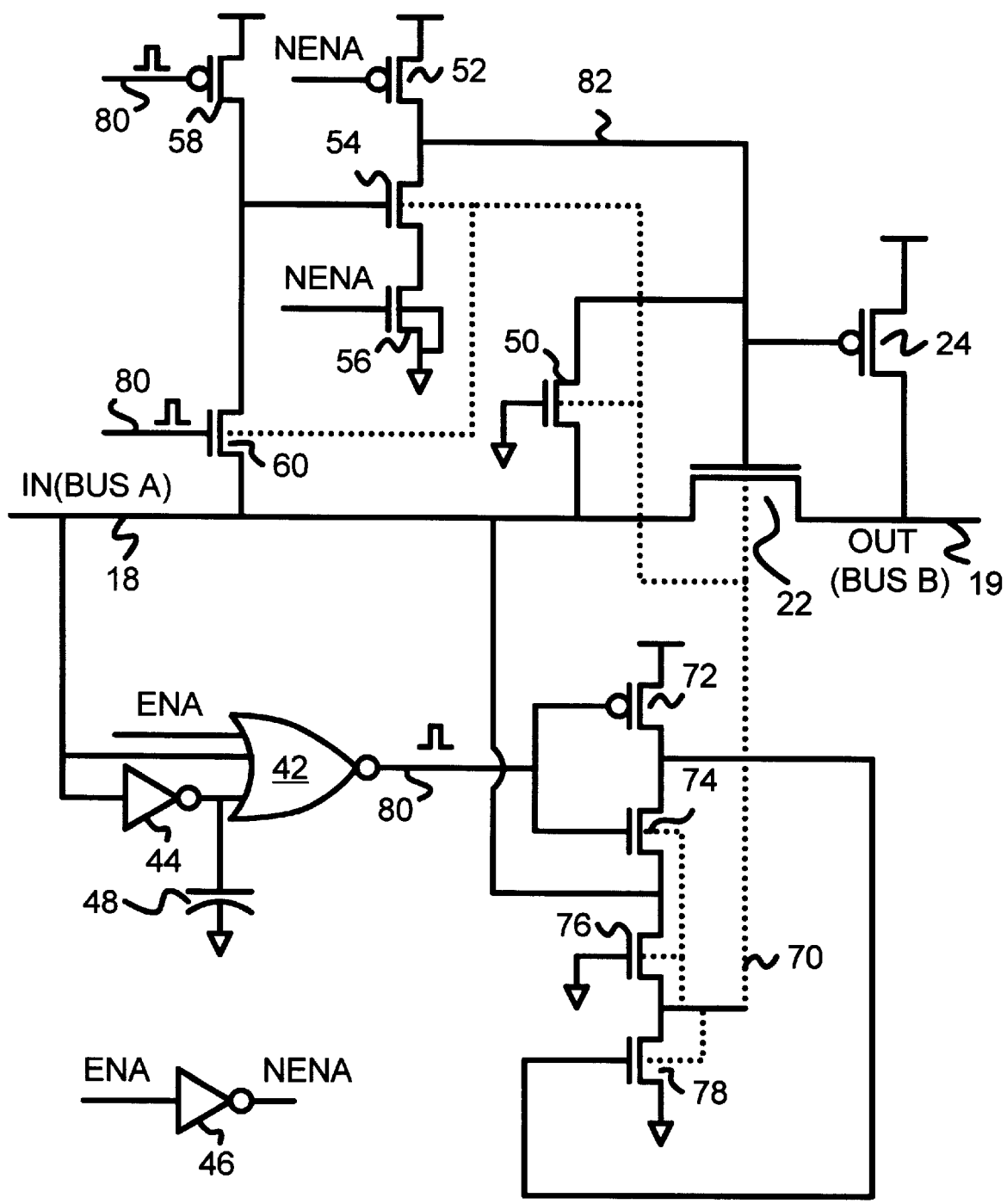
FIG. 9 is a schematic of a gate and well protection circuit for a bus switch using P-well technology.

Undershoot Protector for P-Well—FIGS. 8, 9

FIG. 8 shows a block diagram of an undershoot protection circuit for both the gate and the well under a bus switch when P-well technology is used. When a P-well process is used, the underlying substrate is n-type. The n-channel transistors can be formed in separate, electrically isolated P-wells. The critical bus-switch transistor and its protection circuit can then be located in a P-well that is separated from other P-wells for internal circuitry.

Substrate bias generators increase power consumption and occupy area on the integrated circuit and are therefore preferably avoided. Instead of using a substrate bias generator, well protection switch 33 normally connects the P-well under bus switch transistor 22 to ground. When enable ENA is de-activated, bus switch transistor 22 isolates bus signals 18, 19, but gate protection switch 33 continues to apply ground to the well under bus switch transistor 22. However, de-activating enable ENA arms pulse generator 20, which generates a pulse when a high-to-low transition of input bus signal 18 occurs.

The pulse from pulse generator 30 causes well protection switch 33 to disconnect the well from ground. Instead, the well is connected to input bus signal 18 when an undershoot causes the voltage of input bus signal 18 to fall below ground. If the low-going transition of input bus signal 18 does not generate a sufficiently large undershoot, the well is left floating for the duration of the pulse. The large capacitance c,f the well can maintain a steady ground voltage.

Gate protection switch 32 operates in the same manner as described earlier for FIG. 6. When enable ENA is de-activated, and pulse generator 30 generates a pulse, the gate of bus switch transistor 22 is coupled to the below-ground voltage on input bus signal 18 by gate protection switch 32.

FIG. 9 is a schematic of a gate and well protection circuit for a bus switch using P-well technology. The operation of the gate protection circuit of FIG. 7 is the same as the operation of the gate protection circuit of FIG. 9, including transistors 50, 52, 54, 56, 58, 60. Gate node 82 is connected to input bus signal 18 through connecting transistor 50 during an undershoot. NOR gate 42 generates the pulse for high-to-low transitions of input bus signal 18 when enable ENA is deactivated. Pulse signal 80 then turns on connecting transistor 60, which coupled the gate of isolating transistor 54 to input bus signal 18. This isolates n-channel disable transistor 56, which has its substrate connected to ground as does other internal circuitry.

The substrate nodes of n-channel transistors 54, 60, 50 and bus switch transistor 22 are connected together as substrate node 70. These transistors may be formed in physically separate P-wells, or in a common P-well, but the P-wells are electrically connected together as substrate node 70. Normally, substrate node 70 is connected to ground through n-channel grounding transistor 78. The gate of grounding transistor 78 is normally driven high by p-channel transistor 72, when pulse signal 80 is low.

When enable ENA is deactivated, and input bus signal 18 goes low, NOR gate 42 generates a positive pulse on pulse signal 80. This pulse turns off p-channel transistor 72 but turns on n-channel pulsed transistor 74. The gate of grounding transistor 78 is then driven to ground or below by input bus signal 18 through n-channel pulsed transistor 74. Thus grounding transistor 78 turns off, isolating substrate node 70 from ground.

If no undershoot occurs on input bus signal 18, connecting transistor 76 does not turn on since its gate is connected to ground. The P-well of substrate node 70 is left floating, and its large capacitance keeps the substrate at ground for the short period of the pulse. When the undershoot is less than a transistor threshold below ground, connecting transistor 76 likewise does not turn on, although some sub-threshold current may flow.

However, when the undershoot on input bus signal 18 is larger than about a volt below ground, connecting transistor 76 turns on as its gate-to-source voltage is positive and exceeds the threshold voltage. Connecting transistor 76 drives substrate node 70 to the below-ground voltage of input bus signal 18. Thus the well under bus switch transistor 22 is drive below ground to the same voltage as input bus signal 18. The source-to-substrate voltage of bus switch transistor 22 remains at zero, preventing a parasitic base-emitter junction from becoming forward biased.

Thus both gate node 82 and substrate node 70 are driven below ground to track the undershoot on input bus signal 18. Bus switch transistor 22 is prevented from turning on during these extreme conditions. Output bus signal 19 is isolated from undershoots on input bus signal 18.

Figure 10:
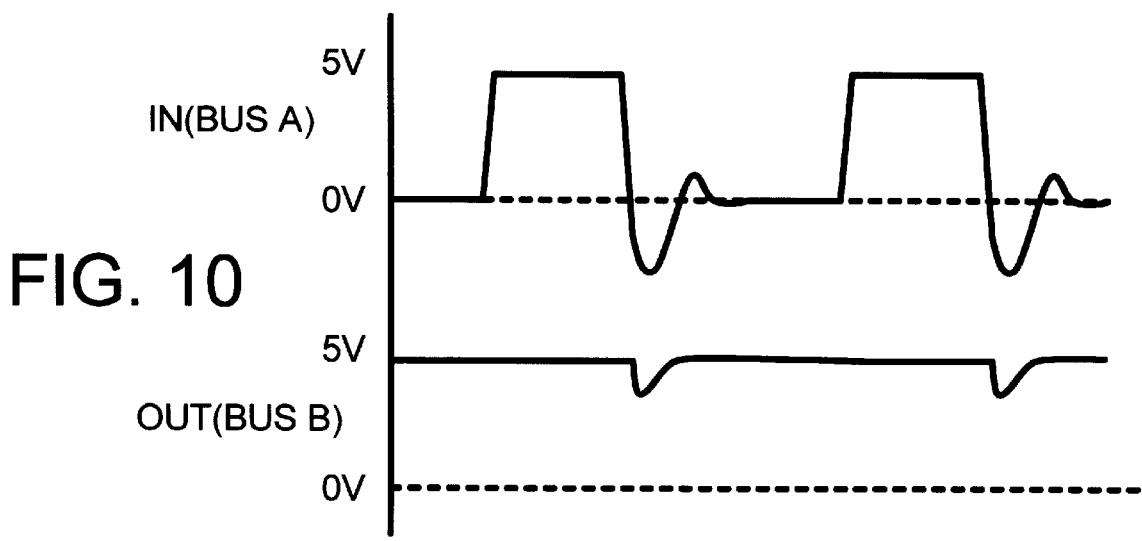
FIG. 10 is a waveform showing that the output of a bus switch is protected from undershoots on the inputs.

Output Protected from Undershoots—FIG. 10

Figure 1:
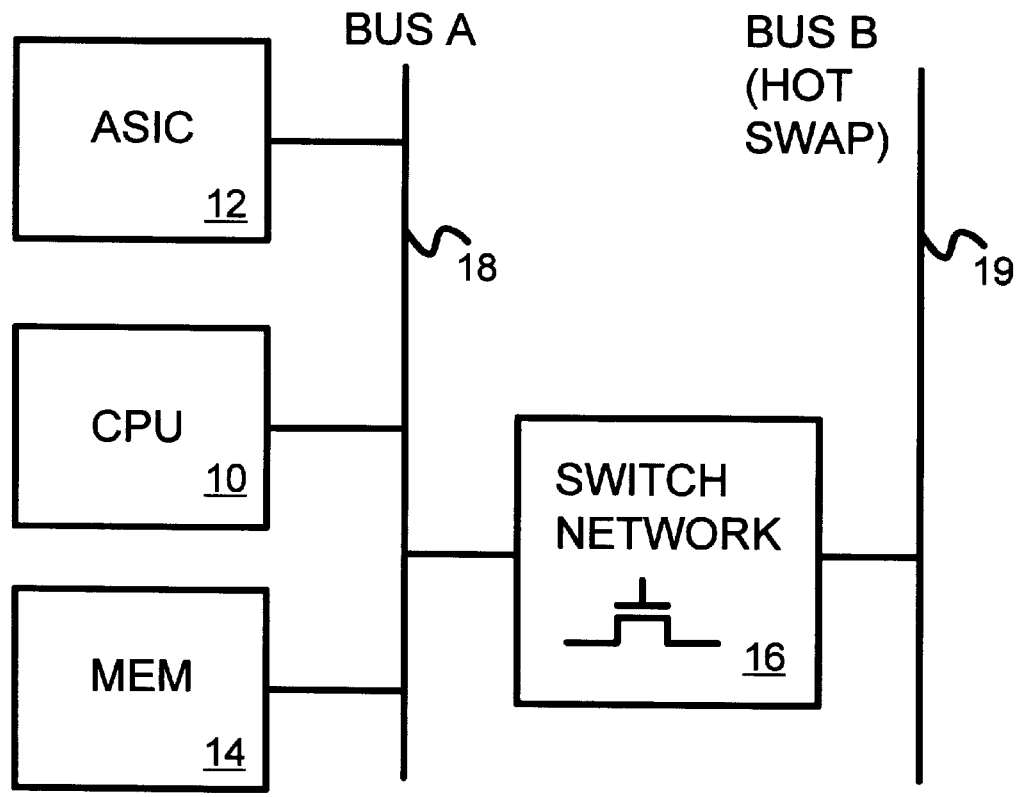
FIG. 1 shows a typical application of a bus switch.
Figure 2:
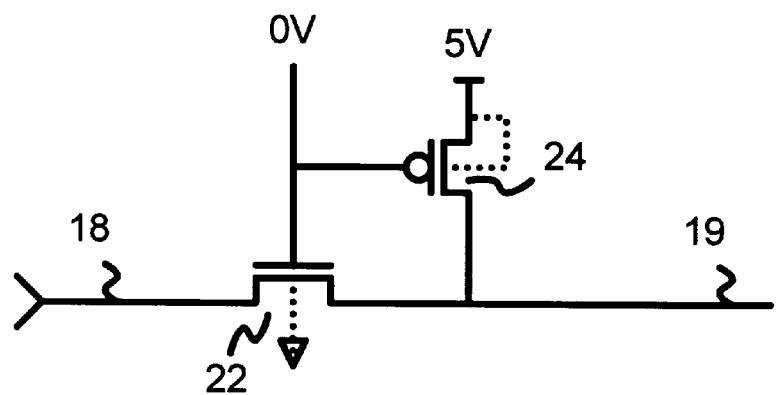
FIG. 2 illustrates a single bit of a bus switch.
Figure 3:
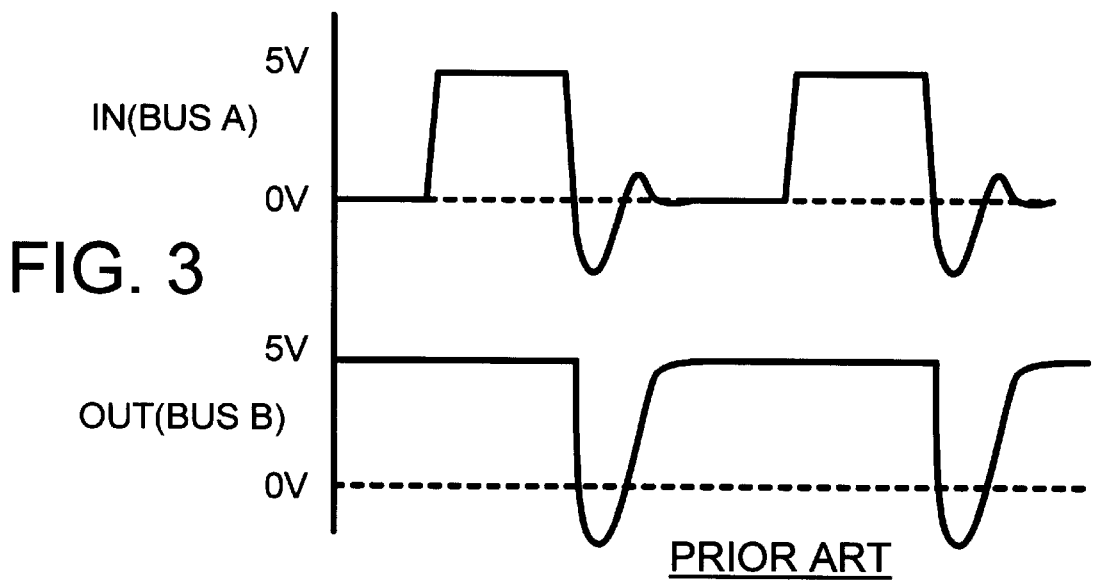
FIG. 3 illustrates an undershoot problem with the bus switch of FIG. 2.
Figure 4:
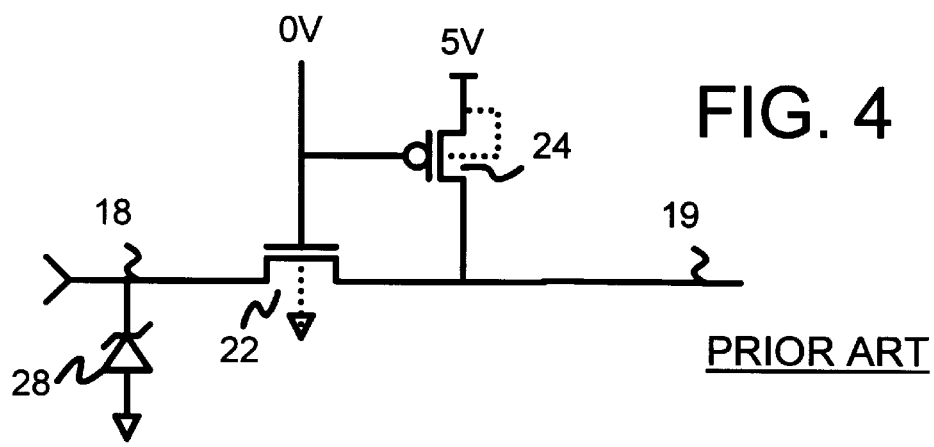
FIG. 4 shows a bus-switch protected from undershoots by a Schottky diode.
Figure 5:
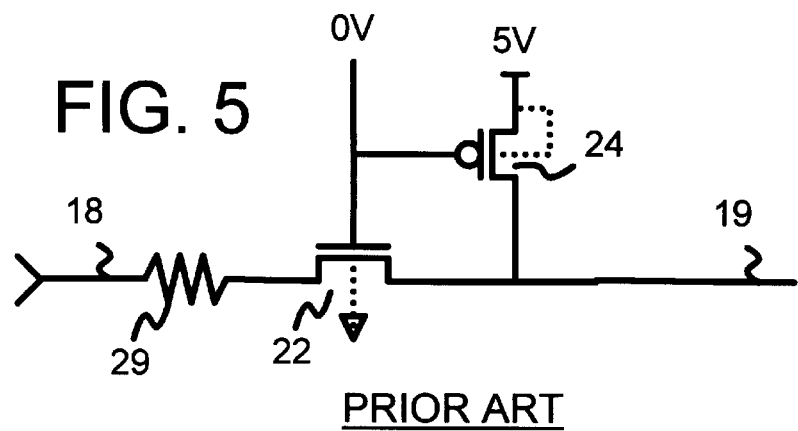
FIG. 5 highlights using a series resistor to reduce undershoot.

FIG. 10 is a waveform showing that the output of a bus switch is protected from undershoots on the inputs. Even when the high-to-low transitions of the input to the bus switch undershoot ground by several volts, the output remains close to the power-supply voltage. Although the output voltage dips somewhat from the extreme undershoot, the output voltage does not fall enough to cross the logic threshold. Compared with FIG. 2, where the output fell from power to below ground, much additional protection is provided.

ADVANTAGES OF THE INVENTION

A bus switch using CMOS technology is protected from undershoot on the input. Protection is provided when the bus switch is isolating its output from its input. An active undershoot-protection circuit uses CMOS transistors that can be easily fabricated. Special fabrication process steps are not needed. The low on-resistance and low capacitance of the bus switch are maintained. Series resistors or special diodes are not added. A more fully-isolating bus switch is achieved.

ALTERNATE EMBODIMENTS

Several other embodiments are contemplated by the inventor. For example the invention can be reversed for use with p-channel bus-switch transistors. Overshoot as well as undershoot protection could be provided. The invention can be applied to non-standard processes such as silicon-on-insulator (SOI). A p-channel transistor can be added in parallel to the n-channel bus-switch transistor to create a full-CMOS bus switch. The protection circuit for the n-channel bus-switch transistor is still effective.

The pullup p-channel transistor can be eliminated, or replaced with a pullup resistor. A pullup resistor can also be added in series with the p-channel pullup transistor. The terms source and drain can be considered interchangeable, depending on the current voltages applied. Likewise, the input and output of the bus switch can be reversed or interchanged for bi-directional bus switches. Many other pulse-generator circuits such as NAND-based circuits can be substituted for the NOR-gate pulse generator shown. Parasitic capacitances may be used rather than an explicit capacitor for the delay in the pulse generator.

Isolating transistor 54 is integrated with a driver that includes transistors 52, 56. The driver can be separated by removing isolating transistor 54 from between transistors 52, 56. Then the drains of transistors 52, 56 connect together directly. Isolating transistor 54 is then connected between the drains of transistors 52, 56 and gate node 82. A p-channel transistor with a grounded gate can be added in parallel to isolating transistor 54.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An undershoot-protected bus switch comprising:

an input;

an output;

an enable signal for indicating when the bus switch is in an isolation mode when the input is isolated from the output and for indicating a connection mode when the bus switch conducts current between the input and the output;

a bus-switch transistor, coupled to connect the input to the output during connection mode, but to isolate the input from the output during isolation mode, the bus-switch transistor being controlled by a gate connected to a gate node;

a connecting transistor, coupled to conduct from the input to the gate node during an undershoot below ground on the input;

a pulse generator, coupled to the input, for generating a pulse in response to a transition of the input during the isolation mode;

an enabling transistor, controlled by the enable signal, for driving an enabling voltage onto the gate node during the connection mode;

a disabling transistor, controlled by the enable signal, for driving a disabling voltage onto the gate node during the isolation mode; and an isolating transistor, coupled between the disabling transistor and the gate node, the isolating transistor isolating the disabling transistor from the gate node in response to the pulse from the pulse generator, whereby the disabling transistor is isolated by the pulse while the gate node is driven by the undershoot through the connecting transistor.

2. The undershoot-protected bus switch of claim 1 wherein the connecting transistor has a gate connected to ground, wherein the connecting transistor conducts current when the undershoot on the input falls more than a transistor threshold below ground.

3. The undershoot-protected bus switch of claim 2 further comprising:

a connecting-pulse transistor, coupled to the pulse generator and coupled to conduct current between the input and a gate of the isolating transistor when the pulse is generated by the pulse generator, whereby the gate of the isolating transistor is driven by the undershoot on the input.

4. The undershoot-protected bus switch of claim 3 wherein the gate of the isolating transistor is pulled below ground when an undershoot occurs on the input when the pulse is generated during the isolation mode.

5. The undershoot-protected bus switch of claim 4 further comprising:

a pulse transistor, for driving the gate of the isolating transistor with a voltage sufficient to turn on the isolating transistor so that the isolating transistor connects the disabling transistor to the gate node, whereby the isolating transistor connects the disabling transistor to the gate node of the bus-switch transistor when no pulse is generated.

6. The undershoot-protected bus switch of claim 5 wherein the bus-switch transistor, the connecting transistor, the disabling transistor, the connecting-pulse transistor, and the isolating transistor are n-channel transistors.

7. The undershoot-protected bus switch of claim 6 wherein the bus-switch transistor, the connecting transistor, the disabling transistor, the connecting-pulse transistor, and the isolating transistor are each n-channel transistors formed in an electrically common p-type substrate, whereby the bus switch is fabricated with an N-well process.

8. The undershoot-protected bus switch of claim 7 further comprising:

a substrate-bias generator, coupled to the electrically common p-type substrate, for driving the electrically common p-type substrate to a bias voltage below ground, whereby a substrate under the bus-switch transistor is protected from undershoots by being biased below ground.

9. The undershoot-protected bus switch of claim 6 further comprising:

a well-protection circuit, coupled to protected substrate nodes of the bus-switch transistor, the connecting transistor, the connecting-pulse transistor, and the isolating transistor, for driving the protected substrate nodes to ground during the connection mode, but for connecting the undershoot on the input to the protected substrate nodes when a pulse is generated during the isolation mode, whereby the undershoot on the input is coupled to drive the protected substrate nodes to prevent the bus-switch transistor from turning on during the isolation mode.

10. The undershoot-protected bus switch of claim 9 wherein the disabling transistor is not connected to the protected substrate nodes of the bus-switch transistor and the isolating transistor, wherein the disabling transistor has a separate substrate node connected to ground, wherein a P-well process is used to fabricate the bus switch, wherein separate P-wells are isolated by an n-type substrate.

11. The undershoot-protected bus switch of claim 9 wherein the well-protection circuit comprises:

a grounding transistor for connecting the protected substrate nodes to ground a well-connecting transistor, coupled to conduct current between the input and the protected substrate nodes when the undershoot occurs on the input, whereby the protected substrate nodes are driven by the undershoot on the input when the pulse is generated.

12. The undershoot-protected bus switch of claim 11 wherein the well-connecting transistor is an n-channel transistor having a gate connected to ground and a substrate connected to the protected substrate nodes;

wherein the grounding transistor is an n-channel transistor having a substrate connected to the protected substrate nodes.

13. The undershoot-protected bus switch of claim 12 wherein the well-protection circuit further comprises:

a p-channel transistor for driving a gate of the grounding transistor to a high voltage;

an n-channel pulsed transistor, coupled to conduct current between gate of the grounding transistor and the input, the n-channel pulsed transistor having a substrate connected to the protected substrate nodes, whereby the gate of the grounding transistor is connected to the input when the pulse occurs.

14. The undershoot-protected bus switch of claim 13 further comprising:

an inverter, receiving the enable signal, for generating an inverse of the enable signal;

wherein the enabling transistor and the disabling transistor each have a gate connected to the inverse of the enable signal from the inverter, whereby the enabling transistor and the disabling transistor are indirectly controlled by the enable signal.

15. The undershoot-protected bus switch of claim 13 further comprising:

a p-channel pullup transistor, coupled to the output, for pulling the output to a high voltage during the isolation mode, the p-channel pullup transistor having a gate connected to the gate node of the bus-switch transistor.

16. A bus switch device comprising:

a bus-switch transistor, having a gate connected to a gate-control node, a source connected to an input and a drain connected to an output, for conducting between the input and the output when the gate-control node is high a connecting transistor, having a source connected to the input and a drain connected to the gate-control node, the connecting transistor being an n-channel transistor with a gate coupled to ground, the connecting transistor conducting when an undershoot occurs on the input;

an enabling transistor, having a gate connected to a disable signal and a drain connected to the gate-control node, for driving the gate-control node high when the disable signal is low, the enabling transistor being a p-channel transistor;

an isolating transistor, having a gate connected to a second node, for connecting the gate-control node to a source node, the isolating transistor being an n-channel transistor; and a disabling transistor, having a gate connected to the disable signal and a drain connected to the source node of the isolating transistor, for driving the gate-control node low when the disable signal is high, the enabling transistor being a n-channel transistor;

wherein the second node is driven low when the disable signal is high, whereby the undershoot below ground on the input are coupled to the gate-control node to prevent the undershoot from turning on the bus-switch transistor.

17. The bus switch device of claim 16 further comprising:

a second connecting transistor, having a source connected to the input and a drain connected to the second node, the second connecting transistor being an n-channel transistor with a gate coupled to a pulse signal, the second connecting transistor conducting in response to the pulse signal;

a pulsed transistor, having a drain connected to the second node and a gate connected to the pulse signal, for driving the second node high when no pulse occurs on the pulse signal; and a pulse generator, coupled to the input, for generating the pulse on the pulse signal when a high-to-low transition of the input occurs when the disable signal disables the bus-switch transistor, wherein the second node is pulsed low through the second connecting transistor by the high-to-low transition of the input to protect the bus-switch transistor only when the undershoot can occur, whereby protection from the undershoot is timed to the high-to-low transition of the input.

18. The bus switch device of claim 17 further comprising:

a grounding transistor, having a source connected to ground and a drain connected to a well node, the grounding transistor being an n-channel transistor with a gate coupled to a third node;

a third connecting transistor, having a source connected to the well node and a drain connected to the input, the third connecting transistor being an n-channel transistor with a gate connected to ground, the third connecting transistor conducting in response to the undershoot on the input;

a second pulsed transistor, having a source connected to the input and a drain connected to the third node, the second pulsed transistor being an n-channel transistor with a gate coupled to the pulse signal, the third pulsed transistor conducting in response to the pulse signal; and a third pulsed transistor, having a drain connected to the third node, the third pulsed transistor being a p-channel transistor with a gate coupled to the pulse signal, the third pulsed transistor conducting in response to the pulse signal;

wherein the well node is coupled to a P-well under the bus-switch transistor;

whereby the well node is driven below ground by the undershoot on the input when the pulse on the pulse signal occurs to protect the P-well under the bus-switch transistor during the undershoot.

19. A bus switch comprising:

input means;

output means;

enable-signal means for indicating when the bus switch is in an isolation mode when the input means is isolated from the output means and for indicating a connection mode when the bus switch conducts current between the input means and the output means;

bus-switch transistor means for connecting the input means to the output means during connection mode, but for isolating the input means from the output means during isolation mode, the bus-switch transistor means being controlled by a gate connected to a gate node;

connecting transistor means for conducting from the input means to the gate node during an undershoot below ground on the input means;

pulse means, coupled to the input means, for generating a pulse in response to a transition of the input means during the isolation mode;

enabling transistor means, controlled by the enable-signal means, for driving an enabling voltage onto the gate node during the connection mode;

disabling transistor means, controlled by the enable-signal means, for driving a disabling voltage onto the gate node during the isolation mode; and isolating transistor means, coupled between the disabling transistor means and the gate node, for isolating the disabling transistor means from the gate node in response to the pulse from the pulse means, whereby the disabling transistor means is isolated by the pulse while the gate node is driven by the undershoot through the connecting transistor means.

20. The bus switch of claim 19 further comprising:

pullup means, coupled to the output means, for pulling the output means to a high voltage during the isolation mode.

* * * * *